US008530980B2

(12) United States Patent
Lin et al.

(10) Patent No.: US 8,530,980 B2
(45) Date of Patent: Sep. 10, 2013

(54) GATE STACK STRUCTURE WITH ETCH STOP LAYER AND MANUFACTURING PROCESS THEREOF

(75) Inventors: Kun-Hsien Lin, Tainan County (TW); Hsin-Fu Huang, Tainan (TW); Chi-Mao Hsu, Tainan County (TW); Chin-Fu Lin, Tainan (TW); Chun-Yuan Wu, Yunlin County (TW)

(73) Assignee: United Microelectronics Corp., Hsinchu (TW)

( * ) Notice: Subject to any disclaimer, the term of this patent is extended or adjusted under 35 U.S.C. 154(b) by 232 days.

(21) Appl. No.: 13/094,953

(22) Filed: Apr. 27, 2011

(65) Prior Publication Data
US 2012/0273902 A1 Nov. 1, 2012

(51) Int. Cl.
*H01L 29/78* (2006.01)

(52) U.S. Cl.
USPC ............ 257/411; 257/410; 257/E29.255

(58) Field of Classification Search
USPC .................. 257/410, 411, E29.255
See application file for complete search history.

(56) References Cited

U.S. PATENT DOCUMENTS

| 6,066,533 | A | 5/2000 | Yu |
| 6,492,217 | B1 | 12/2002 | Bai |
| 6,552,377 | B1 | 4/2003 | Yu |
| 6,696,345 | B2 | 2/2004 | Chau |
| 6,790,719 | B1 | 9/2004 | Adetutu |
| 6,794,234 | B2 | 9/2004 | Polishchuk |
| 6,902,969 | B2 | 6/2005 | Adetutu |
| 6,921,711 | B2 | 7/2005 | Cabral, Jr. |
| 7,030,430 | B2 | 4/2006 | Doczy |
| 7,074,664 | B1 | 7/2006 | White |
| 7,109,079 | B2 | 9/2006 | Schaeffer, III |
| 7,126,199 | B2 | 10/2006 | Doczy |
| 7,148,548 | B2 | 12/2006 | Doczy |
| 7,157,378 | B2 | 1/2007 | Brask |
| 7,208,366 | B2 | 4/2007 | Tsai |
| 7,381,619 | B2 | 6/2008 | Wang |
| 7,488,656 | B2 | 2/2009 | Cartier |
| 7,799,630 | B2 | 9/2010 | Yu |
| 7,888,195 | B2 * | 2/2011 | Lin et al. ............... 438/199 |
| 2002/0127888 | A1 | 9/2002 | Cho |
| 2005/0095763 | A1 | 5/2005 | Samavedam |
| 2005/0275035 | A1 | 12/2005 | Mathew |
| 2006/0040482 | A1 | 2/2006 | Yang |
| 2007/0037335 | A1 | 2/2007 | Chambers |

(Continued)

FOREIGN PATENT DOCUMENTS

| TW | 423061 | 2/2001 |
| TW | 466607 | 12/2001 |
| TW | I297926 | 6/2008 |
| TW | 201019418 | 5/2010 |

*Primary Examiner* — Victor A Mandala
(74) *Attorney, Agent, or Firm* — Ding Yu Tan

(57) ABSTRACT

A gate stack structure with an etch stop layer is provided. The gate stack structure is formed over a substrate. A spacer is formed on a sidewall of the gate stack structure. The gate stack structure includes a gate dielectric layer, a barrier layer, a repair layer and the etch stop layer. The gate dielectric layer is formed on the substrate. The barrier layer is formed on the gate dielectric layer. The barrier layer and an inner sidewall of the spacer collectively define a trench. The repair layer is formed on the barrier layer and an inner wall of the trench. The etch stop layer is formed on the repair layer.

9 Claims, 3 Drawing Sheets

(56) References Cited

U.S. PATENT DOCUMENTS

| | | |
|---|---|---|
| 2007/0082445 A1 | 4/2007 | Yang |
| 2007/0148838 A1 | 6/2007 | Doris |
| 2007/0210354 A1 | 9/2007 | Nabatame |
| 2008/0076216 A1 | 3/2008 | Pae |
| 2008/0318371 A1 | 12/2008 | Lin |
| 2009/0057787 A1 | 3/2009 | Matsuki |
| 2010/0052074 A1 | 3/2010 | Lin |
| 2010/0068877 A1 | 3/2010 | Yeh |
| 2010/0081262 A1 | 4/2010 | Lim |
| 2011/0108928 A1* | 5/2011 | Tao et al. ................ 257/410 |
| 2012/0256275 A1* | 10/2012 | Huang et al. ............ 257/410 |
| 2012/0256276 A1* | 10/2012 | Hwang et al. ............ 257/410 |

* cited by examiner

GATE STACK STRUCTURE WITH ETCH STOP LAYER AND MANUFACTURING PROCESS THEREOF

FIELD OF THE INVENTION

The present invention relates to a gate stack structure with an etch stop layer, and more particularly to a gate stack structure with an etch stop layer at high formation speed and high coverage percentage. The present invention also relates to a manufacturing process of the etch stop layer.

BACKGROUND OF THE INVENTION

During the process of fabricating a gate stack structure of a complementary metal-oxide-semiconductor (CMOS), tantalum nitride (TaN) is usually used as an etch stop layer to prevent from over-etching a work function metal layer. However, since the efficacy of using such etch stop layer to prevent from over-etching the work function metal layer is usually unsatisfied, a barrier layer underneath the etch stop layer may be lost. Under this circumstance, the performance, yield and reliability of the final product will be adversely affected.

SUMMARY OF THE INVENTION

Therefore, the object of the present invention is to provide a gate stack structure with an etch stop layer. For repairing a damaged surface of a barrier layer, a repair layer whose material and electrical property are similar to the barrier layer is formed on the barrier layer. By means of the repair layer, an etch stop layer is formed within a trench of the gate stack structure at increased formation speed and thickness in a subsequent process. As a consequence, a current leakage problem is eliminated.

In accordance with an aspect, the present invention provides a gate stack structure with an etch stop layer. The gate stack structure is formed over a substrate. A spacer is formed on a sidewall of the gate stack structure. The gate stack structure includes a gate dielectric layer, a barrier layer, a repair layer and the etch stop layer. The gate dielectric layer is formed on the substrate. The barrier layer is formed on the gate dielectric layer. The barrier layer and an inner sidewall of the spacer collectively define a trench. The repair layer is formed on the barrier layer and an inner wall of the trench. The etch stop layer is formed on the repair layer.

In accordance with another aspect, the present invention provides a manufacturing process of an etch stop layer. Firstly, a substrate is provided. A gate stack structure is formed over the substrate, wherein the gate stack structure at least comprises a dummy polysilicon layer and a barrier layer. The dummy polysilicon layer is removed to define a trench and expose a surface of the barrier layer. A repair layer is formed on the surface of barrier layer and an inner wall of the trench. Afterwards, an etch stop layer is formed on the repair layer.

BRIEF DESCRIPTION OF THE DRAWINGS

The above objects and advantages of the present invention will become more readily apparent to those ordinarily skilled in the art after reviewing the following detailed description and accompanying drawings, in which.

DETAILED DESCRIPTION OF PREFERRED EMBODIMENTS

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Figure 1:
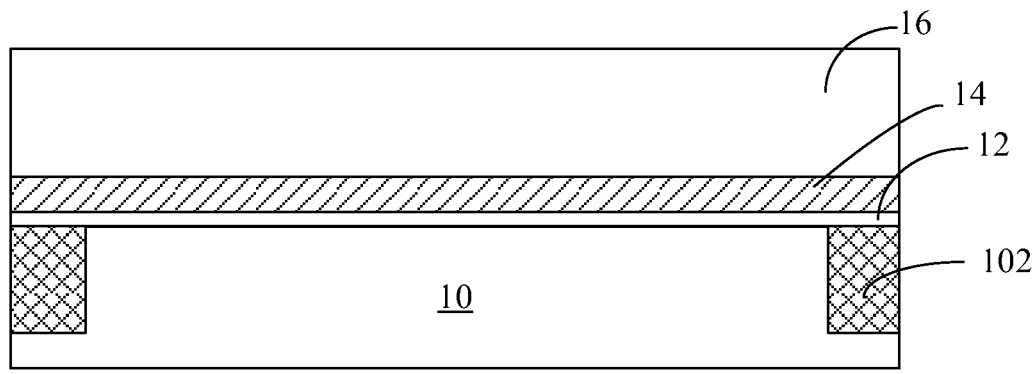
FIG. 1 schematically illustrates a gate dielectric layer, a barrier layer and a dummy polysilicon layer formed on a substrate.
Figure 2:
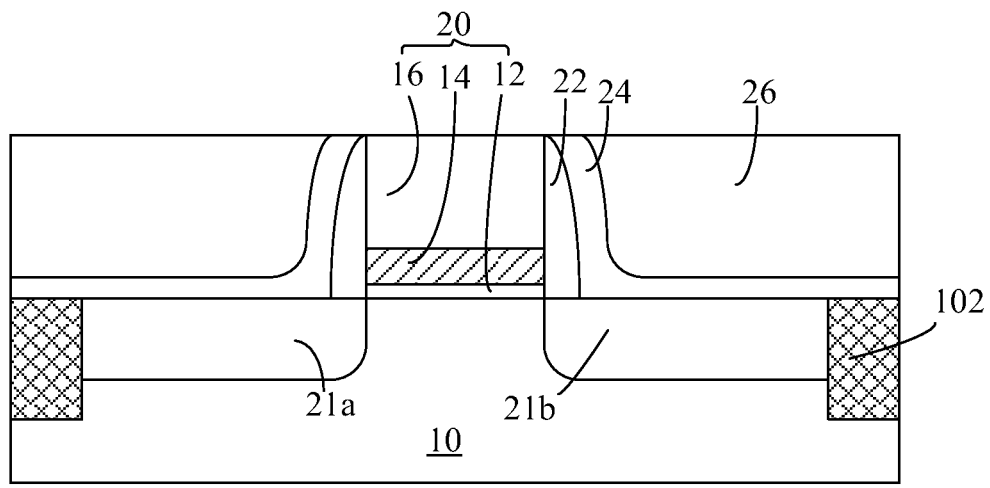
FIG. 2 schematically illustrates a gate stack structure formed over the substrate and a contact etch stop layer and an interlayer dielectric layer formed over the gate stack structure.
Figure 3:
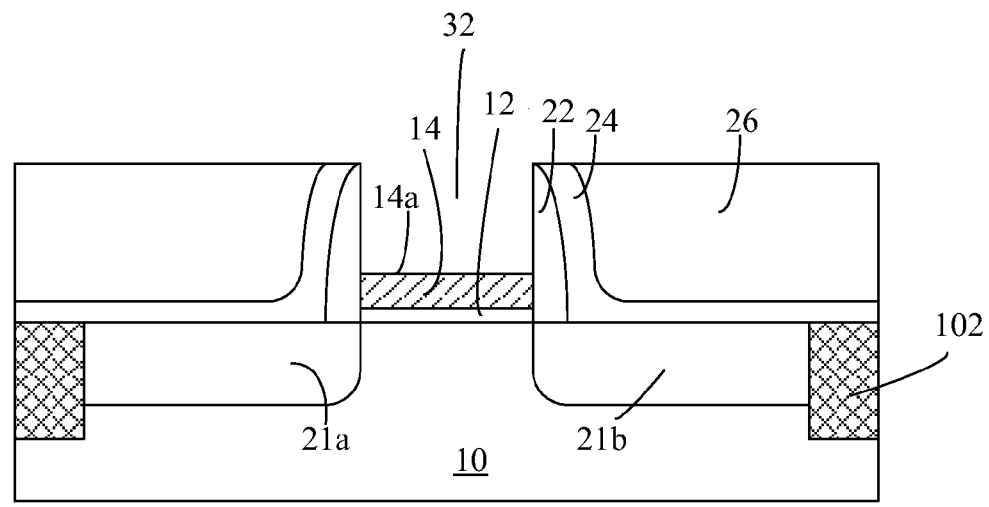
FIG. 3 schematically illustrates the gate stack structure whose dummy polysilicon layer is removed.
Figure 4:
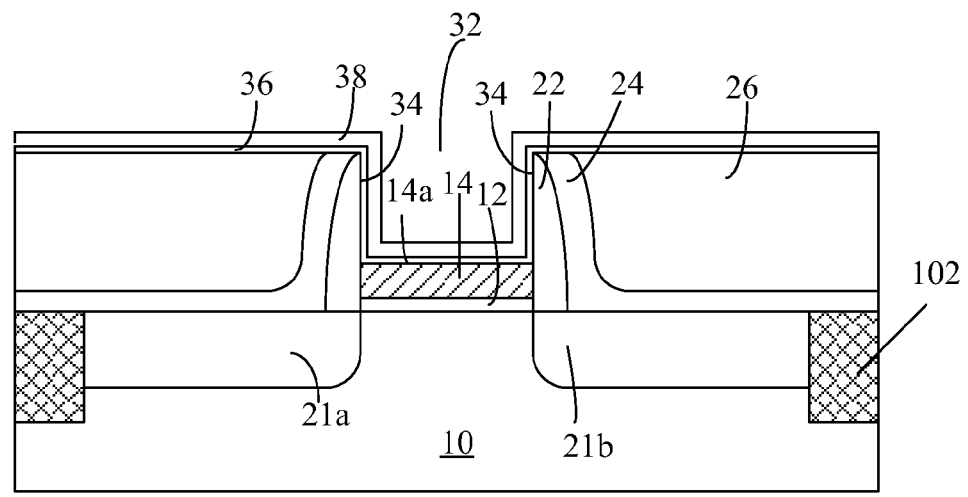
FIG. 4 schematically illustrates a repair layer and an etch stop layer formed within the trench of the gate stack structure.
Figure 5:
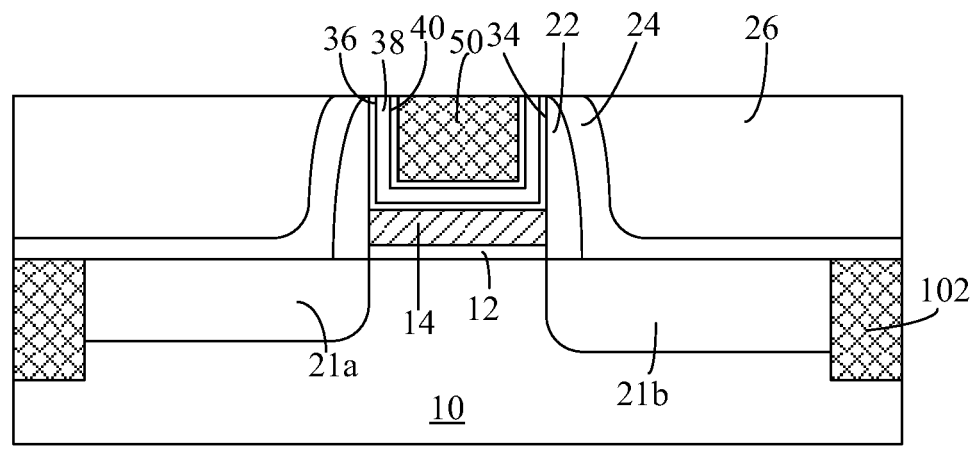
FIG. 5 schematically illustrates an N-type work function metal layer and a low-resistance metal layer formed within the trench of the gate stack structure.

FIG. 1 schematically illustrates a gate dielectric layer, a barrier layer and a dummy polysilicon layer formed on a substrate. FIG. 2 schematically illustrates a gate stack structure formed over the substrate and a contact etch stop layer and an interlayer dielectric layer formed over the gate stack structure. FIG. 3 schematically illustrates the gate stack structure whose dummy polysilicon layer is removed. FIG. 4 schematically illustrates a repair layer and an etch stop layer formed within the trench of the gate stack structure. FIG. 5 schematically illustrates an N-type work function metal layer and a low-resistance metal layer formed within the trench of the gate stack structure.

Hereinafter, a gate stack structure with an etch stop layer and a manufacturing process thereof will be illustrated with reference to FIGS. 1~5.

Please refer to FIG. 1, which schematically illustrates a gate dielectric layer, a barrier layer and a dummy polysilicon layer formed on a substrate. Firstly, a substrate 10 with a plurality of isolation devices 102 is provided. Then, a high-k gate dielectric layer 12 is formed on the substrate 10 by chemical vapor deposition (CVD), low pressure chemical vapor deposition (LPCVD), atomic layer deposition (ALD) or physical vapor deposition (PVD). In an embodiment, the dielectric constant of the high-k gate dielectric layer 12 is greater than 4. The high-k gate dielectric layer 12 is made of silicon oxynitride, metal oxide or metal silicon oxide such as hafnium oxide, hafnium silicon oxide, lanthanum oxide, zirconium oxide, tantalum oxide or aluminum oxide. In addition, an interfacial layer (not shown) such as silicon oxide layer is optionally formed underneath the gate oxide layer 12.

Then, a barrier layer 14 and a dummy polysilicon layer 16 are sequentially formed on the gate dielectric layer 12. The barrier layer 14 is made of titanium nitride (TiN) or tantalum nitride (TaN) or the combination of both. In addition, the thickness of the barrier layer 14 formed on the gate dielectric layer 12 is in the range between 15 angstroms and 25 angstroms. A mask layer (not shown) can be formed optionally over the dummy polysilicon layer 16, the mask layer is made of silicon nitride, silicon oxide, silicon oxynitride or silicon carbide.

Please refer to FIG. 2, which schematically illustrates a gate stack structure formed over the substrate and a contact etch stop layer and an interlayer dielectric layer formed over the gate stack structure. Then, a patterned photoresist layer (not shown) is formed on the dummy polysilicon layer 16 of the resulting structure FIG. 1. By the patterned photoresist layer, the locations of the gate stack structures of the NMOS and the PMOS of a CMOS are defined. Then, an etching process is performed to sequentially remove portions of the dummy polysilicon layer 16, the barrier layer 14 and the gate dielectric layer 12. Consequently, a gate stack structure 20 is formed over the substrate 10. As previously described, if the etch stop layer is used to prevent from over-etching the P-type work function metal layer of the gate stack structure of the NMOS, the quality of the CMOS is deteriorated. In other words, the present invention is aimed at the gate stack structure of the NMOS. However, the description of the gate stack structure of the PMOS will be omitted.

Please refer to FIG. 2 again. Then, an ion-implanting process (not shown) is performed to form a source region 21a and a drain region 21b in the substrate 10 and beside the gate stack structure 20 by using the gate stack structure 20 and spacer 22 as a mask. Then, a contact etch stop layer (CESL) 24 is formed on the substrate 10, the gate stack structure 20 and the sidewall of the spacer 22. Then, an interlayer dielectric layer (ILD) 26 is formed on the contact etch stop layer 24. Then, a planarization process is performed to remove portions of the interlayer dielectric layer 26 and the contact etch stop layer 24 to expose the surface of the dummy polysilicon layer 16 of the gate stack structure 20.

Please refer to FIG. 3, which schematically illustrates the gate stack structure whose dummy polysilicon layer is removed. Then, an etching process is performed to remove the dummy polysilicon layer 16 of the gate stack structure 20. Consequently, a trench 32 is formed and a surface 14a of the barrier layer 14 is exposed. In an embodiment, the etching process includes a dry etching process of partially removing the dummy polysilicon layer 16 of the gate stack structure 20 and a wet etching process to completely remove the remaining dummy polysilicon layer 16. After the etching process is performed, the surface 14a of the barrier layer 14 is exposed, and the trench 32 is formed within the gate stack structure 20. The etchant solution used in the wet etching process includes but is not limited to TMAH (tetramethylammonium hydroxide) or NH$_4$OH (ammonium hydroxide). The present invention is not limited to completely remove the dummy polysiliocn layer 16 by using individual dry etching process or individual wet etching process.

However, during the process of removing the dummy polysilicon layer 16, if the surface 14a of the barrier layer 14 is eroded by the etchant solution or reacted with the etchant solution, the surface 14a of the barrier layer 14 may be damaged or a portion of the dummy polysilicon layer 16 (not shown) may remain on the surface 14a of the barrier layer 14. The damaged surface 14a of the barrier layer 14 or the remaining dummy polysilicon layer 16 is detrimental to a subsequent step of forming an etch stop layer 34 on the barrier layer 14 because the formation speed is low and the coverage percentage is insufficient.

Please refer to FIG. 4. For increasing the formation speed and the coverage percentage of the etch stop layer 34, after the dummy polysilicon layer 16 of the gate stack structure 20 is removed and the surface 14a of the barrier layer 14 is exposed, a repair layer 36 is formed on an inner wall of the trench 32 of the gate stack structure 20 (i.e. the inner sidewall of the spacer 22) and the surface 14a of the barrier layer 14. The material and electrical property of the repair layer 36 are similar to those of the barrier layer 14. For example, the repair layer 36 is made of titanium nitride (TiN) or titanium (Ti). In addition, the thickness of the repair layer 36 is in the range between 7 angstroms and 15 angstroms. Then, an etch stop layer 38 is formed on the repair layer 36 by an atomic layer deposition process. For example, the etch stop layer 38 is made of tantalum nitride (TaN).

As previously described in the prior art, in a case that no repair layer 36 is formed on the barrier layer 14, the thickness of the etch stop layer (not shown) overlying the barrier layer 14 is relatively thinner (e.g. 10 angstroms). On the other hand, in a case that the repair layer 36 is formed on the barrier layer 14, the etch stop layer 38 formed on the repair layer 36 has a thickness in the range between 15 angstroms and 25 angstroms. That is, after the repair layer 36 is formed on the barrier layer 14 of the gate stack structure 20, the etch stop layer 38 has increased formation speed, thickness and coverage percentage.

Moreover, after the etch stop layer 38 formed on the repair layer 36, a P-type work function metal layer (not shown) is further deposited on the etch stop layer 38. Generally, the P-type work function metal layer is made of titanium nitride (TiN). For the NMOS, an etching process is performed to remove the P-type work function metal layer at the predetermined location of the gate stack structure of the NMOS. Then, an N-type work function metal layer 40 is formed on the etch stop layer 38 within the trench 32. For example, the N-type work function metal layer 40 is made of hafnium, titanium, tantalum, aluminum or an alloy thereof. Then, a low-resistance metal layer 50 (e.g. an aluminum layer) is filled into the trench 32. The resulting structure of the NMOS of the CMOS is shown in FIG. 5.

From the above description, the present invention provides a gate stack structure with an etch stop layer and a manufacturing process thereof. By means of the repair layer formed on the barrier layer, the etch stop layer can be formed within the trench of the gate stack structure at increased formation speed and coverage percentage. As a consequence, a current leakage problem is eliminated and the device reliability is enhanced.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A gate stack structure with an etch stop layer, the gate stack structure being formed over a substrate, a spacer being formed on a sidewall of the gate stack structure, the gate stack structure comprising:
    a gate dielectric layer formed on the substrate;
    a barrier layer formed on the gate dielectric layer, wherein the barrier layer and an inner sidewall of the spacer collectively define a trench, and the barrier layer has a thickness in the range between 15 angstroms and 25 angstroms;
    a repair layer formed on the barrier layer and an inner wall of the trench; and the etch stop layer formed on the repair layer.

2. The gate stack structure according to claim 1, wherein the gate dielectric layer has a dielectric constant greater than 4.

3. The gate stack structure according to claim 1, wherein the barrier layer is made of titanium nitride (TiN).

4. The gate stack structure according to claim 1, wherein the repair layer is made of titanium nitride (TiN) or titanium (Ti).

5. The gate stack structure according to claim 1, wherein the repair layer has a thickness in the range between 7 angstroms and 15 angstroms.

6. The gate stack structure according to claim 1, wherein the etch stop layer is made of tantalum nitride (TaN).

7. The gate stack structure according to claim 1, wherein the etch stop layer has a thickness in the range between 15 angstroms and 25 angstroms.

8. The gate stack structure according to claim 1, wherein an N-type work function metal layer is formed on the etch stop layer within the trench.

9. The gate stack structure according to claim 8, wherein the N-type work function metal layer is made of hafnium, titanium, tantalum, aluminum or an alloy thereof.

* * * * *